United States Patent
Weichold (10) Patent No.: US 11,287,448 B2
(45) Date of Patent: Mar. 29, 2022

(54) VOLTAGE DIVIDER ASSEMBLY

(71) Applicant: 3M INNOVATIVE PROPERTIES COMPANY, St. Paul, MN (US)

(72) Inventor: Jens Weichold, Erkelenz (DE)

(73) Assignee: 3M Innovative Properties Company, St. Paul, MN (US)

( * ) Notice: Subject to any disclaimer, the term of this patent is extended or adjusted under 35 U.S.C. 154(b) by 42 days.

(21) Appl. No.: 16/757,592

(22) PCT Filed: Oct. 30, 2018

(86) PCT No.: PCT/IB2018/058515
§ 371 (c)(1),
(2) Date: Apr. 20, 2020

(87) PCT Pub. No.: WO2019/097334
PCT Pub. Date: May 23, 2019

(65) Prior Publication Data
US 2020/0278382 A1 Sep. 3, 2020

(30) Foreign Application Priority Data
Nov. 20, 2017 (EP) .................................... 17202528

(51) Int. Cl.
*G01R 15/06* (2006.01)
(52) U.S. Cl.
CPC .................................... *G01R 15/06* (2013.01)
(58) Field of Classification Search
CPC ................................ G01R 15/06; G01R 31/58
See application file for complete search history.

(56) References Cited

U.S. PATENT DOCUMENTS

| 2005/0122122 A1* | 6/2005 | Yakymyshyn | G01R 15/06 324/705 |
| 2010/0188110 A1* | 7/2010 | Sun | G01N 33/0031 324/694 |
| 2014/0361798 A1* | 12/2014 | Johnson | G01R 31/3191 324/750.02 |

(Continued)

FOREIGN PATENT DOCUMENTS

| DE | 3145255 | 5/1983 |
| DE | 19719521 | 11/1998 |
| EP | 2993480 | 3/2016 |

(Continued)

OTHER PUBLICATIONS

International Search report for PCT International Application No. PCT/IB2018/058515 dated Jan. 23, 2019, 5 pages.

*Primary Examiner* — Farhana A Hoque
(74) *Attorney, Agent, or Firm* — Gregg H. Rosenblatt (57) ABSTRACT

Voltage divider assembly (1) for installation on a power conductor (100) inside a MV/HV switchgear in a power network of a national grid, operable to divide a voltage of the power conductor in a voltage-dividing sensor for sensing a voltage of the power conductor. The voltage divider assembly comprises a) conductive connecting means (180) for mechanically and electrically connecting the voltage divider assembly to the power conductor (100); and b) discrete impedance elements, electrically connected with the connecting means and in series with each other such as to be operable as a high-voltage side of the voltage-dividing sensor.

14 Claims, 3 Drawing Sheets

(56) References Cited

U.S. PATENT DOCUMENTS

2017/0038414 A1    2/2017   Barba Jimenez

FOREIGN PATENT DOCUMENTS

| EP | 3223024 | 9/2017 |
| WO | WO 2009-080109 | 7/2009 |
| WO | WO 2016-187090 | 11/2016 |
| WO | WO 2017-164952 | 9/2017 |

* cited by examiner

VOLTAGE DIVIDER ASSEMBLY

The invention relates to voltage dividers in medium-voltage or high-voltage power networks, in particular to voltage dividers for installation in electrical apparatus in such networks like switchgears. More particularly, the application relates to such voltage dividers that can be operated in voltage-dividing sensors for sensing a voltage of a power conductor in medium-voltage or high-voltage power networks.

BACKGROUND

In order to be able to better exploit the capabilities of large-area electrical power distribution networks ("smart grids"), voltage sensors can be placed in power distribution devices, e.g. switchgears, of the network. Measuring the voltage of the power conductors of a network at switchgears with an adequate precision facilitates better monitoring and automated control of the network.

Traditionally, for voltage sensing, transformers have been externally attached to switchgears. Externally attached transformers, however, are bulky and occupy precious space in the vicinity of the switchgear.

As an alternative to transformers, voltage dividers, outside of switchgears, can be used as voltage sensors with medium-voltage or high-voltage power conductors. A capacitive voltage divider for use on a switchgear is described, for example, in the International Patent Application WO 2009/080109 A1, where a voltage divider is formed by a metal embracing and a concentric ring-shaped inner electrode ring, separated by a dielectric spacer layer.

Voltage dividers for sensing a voltage of a power conductor have been integrated into elements on the outside of a switchgear, such as bushings, or into elements connected to a switchgear, such as cable connectors or elbow plugs. Such external dividers may, however, cause problems with respect to safety, or may make type approval of the entire system more difficult.

SUMMARY

In an attempt to address such problems, the present disclosure provides a voltage divider assembly for installation on a power conductor inside a compartment of a MV/HV switchgear in a power network of a national grid, wherein the voltage divider assembly is operable to divide a voltage of the power conductor in a voltage-dividing sensor for sensing a voltage of the power conductor, characterized in that the voltage divider assembly comprises
a) connecting means, comprising a conductive portion, for mechanically and electrically connecting the voltage divider assembly to the power conductor; and
b) a plurality of discrete impedance elements, electrically connected (i) with the conductive portion of the connecting means and (ii) in series with each other such as to be operable as a high-voltage side of the voltage-dividing sensor.

According to the present disclosure, the voltage divider of a voltage sensor is adapted to be installed on a power conductor inside a switchgear. Installation within the switchgear may avoid potential safety hazards caused by installation on the outside of the switchgear, and/or may require less insulation material. It may also make type approvals easier, because a switchgear-internal voltage divider may not require a separate type approval, but may be part of the overall approval of the entire switchgear.

Installation of the voltage divider inside the switchgear is possible because the plurality of discrete impedance elements forming the high-voltage side of the voltage divider provides for a stepwise, gradual reduction in voltage between the voltage of the power conductor, e.g. of a bus bar, and the much lower signal voltage at the end of the high-voltage side of the divider. The stepwise reduction may help avoid electrical discharges between the bus bar and lower voltage at the end of the high-voltage side of the divider.

The term "medium voltage" (or "MV") as used herein refers to a voltage in the range of about 1 kV ("kilovolt") to about 72 kV versus ground. "High voltage" or "HV" refers to a voltage above about 72 kV versus ground. The term "MV/HV" is used herein as an abbreviation for "medium-voltage or high-voltage".

It should be noted that in the context of the sides of a voltage divider, the term "high-voltage side" refers to the elements of the voltage divider that, when in use, are to be electrically connected to the power conductor, and are then arranged electrically between the power conductor and the signal contact of the voltage divider, as explained below. The signal contact is a contact of the voltage divider where a divided voltage can be picked up. The signal contact is electrically located between the high-voltage side and the low-voltage side of the voltage divider. The term "low-voltage side" refers to those elements of the voltage divider that, when in use, are to be electrically connected to electrical ground or, generally, to a reduced voltage of less than 10% of the operating voltage of the power conductor, and which are then arranged electrically between the reduced voltage contact (or ground) and the signal contact of the voltage divider.

A voltage divider assembly according to the present disclosure may comprise the high-voltage side of a voltage divider and not comprise the low-voltage side of the voltage divider. Alternatively, the voltage divider assembly according to the present disclosure may comprise the high-voltage side and the low-voltage side of the voltage divider. In either case the voltage divider assembly may comprise a signal contact, electrically arranged between the high-voltage side and the low-voltage side of the voltage divider, for picking up a divided voltage, namely a signal voltage, indicative of the voltage of the power conductor versus ground.

Generally, switchgears comprise electrical disconnect switches, and/or fuses or circuit breakers to protect, control or isolate electrical equipment in a power distribution network such as a national grid. A switchgear potentially usable with a voltage divider assembly according to the present disclosure may be, for example, a gas-insulated switchgear, such as one from the ZX family of gas-insulated medium-voltage switchgears commercialized by ABB, or a switchgear of the GHA type available from AREVA T&D, or of the NXPLUS C type available from Siemens AG. Alternatively, the switchgear may be, for example, an air-insulated switchgear or a vacuum-insulated switchgear. In one particular embodiment, the voltage divider assembly is for installation in a medium-voltage gas-insulated switchgear.

Certain MV/HV switchgears are gas-insulated MV/HV switchgears. Gas-insulated switchgears have a compartment containing an insulation gas, such as SF6 gas, pressurized or at ambient pressure, to reduce the risk of discharges and mitigate the detrimental effects of arcing. The compartment is gas-tight, so that the insulation gas cannot escape. In air-insulated switchgears, the insulating gas is air. If the air is used at ambient pressure, the compartment containing the insulation gas may be the outer housing of the entire switchgear. In vacuum-insulated switchgears, the compartment is gas-tight, so that gas cannot enter the compartment and reduce the vacuum.

A "compartment" of a switchgear, as used herein, is a volume inside the switchgear which is delimited by walls. The walls delimiting the compartment may be exterior walls of the switchgear and/or may be interior walls of the switchgear. A compartment may be delimited by at least one exterior wall of the switchgear. A compartment may be a volume inside the switchgear, delimited by walls, that are held on electrical ground. A compartment may be a volume inside the switchgear, delimited by walls, which contains an insulation gas, e.g. pressurized or at ambient pressure. A compartment may be a volume inside the switchgear, delimited by walls, which is held at a pressure below ambient pressure (1013 hectopascal).

In the context of the present disclosure, the term "power conductor" refers to an element in the switchgear that is designed to conduct electrical power at voltages above 1 kV versus ground with currents above 10 ampere. In certain embodiments a power conductor is the central conductor of a section of a MV or HV power cable. In certain embodiments a power conductor is one of a plurality of conductors of a section of a multi-core MV or HV power cable. In other embodiments a power conductor is a bus bar, such as a—hollow or solid—bus bar conducting electrical power from one location to another location within a switchgear. Such a bus bar may have, for example, a rectangular, a square, or a circular cross section.

A voltage-dividing sensor, in the context of the present disclosure, is a voltage sensor for sensing a voltage of a MV/HV power conductor versus ground which uses a voltage divider for sensing the voltage. The voltage-dividing sensor may thus comprise a voltage divider assembly. The voltage divider assembly may comprise a voltage divider.

In such voltage dividers, one or more discrete impedance elements, such as capacitors, resistors or inductances, are electrically connected to the power conductor and together form a high-voltage side of the voltage divider. In the voltage divider, one or more second discrete impedance elements are connected between the high-voltage side of the voltage divider and electrical ground and together form a low-voltage side of the voltage divider. The high-voltage side and the low-voltage side of the voltage divider are thus connected electrically in series between the power conductor and ground.

In a voltage divider assembly according to the present disclosure, the high-voltage side of the voltage divider may be formed by multiple discrete impedance elements electrically connected in series. The same applies to the low-voltage side of the voltage divider. In certain voltage dividers, the high-voltage side is formed by one or more discrete capacitors. In certain voltage dividers, the high-voltage side is formed by one or more discrete resistors. In certain voltage dividers, the high-voltage side is formed by one or more discrete inductances. In certain voltage dividers, the low-voltage side is formed by one or more discrete capacitors. In certain voltage dividers, the low-voltage side is formed by one or more discrete resistors. In certain voltage dividers, the low-voltage side is formed by one or more discrete inductances. The high-voltage-side or the low-voltage side or both sides of a voltage divider according to the present disclosure may be formed by a combination of any number of discrete capacitors, any number of discrete resistors, and any number of discrete inductances.

In certain voltage divider assemblies according to the present disclosure, a signal voltage can be picked up at a signal contact between the high-voltage side of the voltage divider and the low-voltage side. The signal voltage versus ground is proportional to the voltage of the power conductor versus ground, with the proportionality factor depending on the dividing ratio, i.e. the ratio of the impedance of the high-voltage side and the impedance of the low-voltage side of the voltage divider. Once the dividing ratio is known, sensing the signal voltage versus ground is equivalent to sensing the voltage of the power conductor versus ground. A voltage divider assembly according to the present disclosure may thus comprise a signal contact for picking up a signal voltage. The signal contact may be accessible from an outside of the voltage divider assembly, for example in order to connect a signal wire therewith.

The high or medium voltage of the power conductor is divided by the plurality of discrete impedance elements, which are operable as a high-voltage side of a voltage-dividing sensor for sensing the voltage of the power conductor. Thereby, this divided voltage is indicative of the voltage of the power conductor. In an aspect of the present disclosure, the voltage divided by the plurality of discrete impedance elements may be made available for measurement, e.g. for measurement outside the voltage divider assembly or for measurement outside the MV/HV switchgear. A wire may be employed to pick up the divided voltage at one of its ends and make it available at its other end for measurement. Since the divided voltage is the signal desired for sensing the voltage of the power conductor, this wire may be referred to as a "signal wire". Where the voltage divider assembly comprises a signal contact as described above, the signal wire may be connected, at one end, to the signal contact and pick up the divided voltage at the signal contact. Since the signal contact is electrically connected to an impedance element of the plurality of discrete impedance elements, the signal wire may be connected to an impedance element of the plurality of discrete impedance elements.

Thus, in preferred embodiments of the present disclosure, the voltage divider assembly further comprises a signal wire for making a voltage divided by the plurality of discrete impedance elements, and indicative of the voltage of the power conductor, available for measurement.

A voltage divider assembly according to the present disclosure is for installation on a power conductor in a compartment of a MV/HV switchgear. It may be suitable for installation between a power conductor in a compartment of a MV/HV switchgear and a switchgear element on reduced voltage, i.e. of less than 10% of the operating voltage of the power conductor, e.g. a switchgear element held on electrical ground or on a voltage of 100 Volt or less versus ground. The voltage divider assembly therefore comprises connecting means for mechanically and electrically connecting the voltage divider assembly to the power conductor.

The connecting means is electrically conductive, or comprises an electrically conductive portion, for electrically connecting one discrete impedance element of the plurality of discrete impedance elements of the voltage divider assembly to the power conductor. This electrical connection facilitates sensing of the voltage of the power conductor by the voltage dividing sensor comprising the voltage divider assembly.

The connecting means is suitable for mechanically connecting the voltage divider assembly to the power conductor inside a compartment of a MV/HV switchgear. The connecting means may comprise, for example, a clamp, a spring-loaded clamp, a thread, a screw, a latch, a clip, or a slit block. Independent of its shape, the connecting means may provide a long-term reliable mechanical connection of the voltage divider assembly to the power conductor.

The voltage divider assembly may be installed in compartments of different shapes. While the orientation of the connecting means relative to the power conductor will largely be determined by the orientation of the power conductor, it may be advantageous, e.g. for versatility, if other components of the voltage divider assembly can have a variable orientation. For that purpose it may thus be considered to have other portions of the voltage divider assembly be movable relative to the connecting means or vice versa. Therefore, in certain embodiments in which the voltage divider assembly has an elongate shape defining a length direction of the voltage divider assembly, a first end portion, an opposed second end portion and a middle portion, connecting the first and second end portions, of the voltage divider assembly, wherein the first end portion comprises the connecting means, the connecting means is movable relative to the middle portion.

When installing the voltage divider assembly as described herein on a power conductor, it may be necessary to reposition the voltage divider assembly. It may therefore be desirable that the voltage divider assembly can be released from the power conductor on which it has been previously installed. Such a releasability may also be desirable when a voltage divider assembly is supposed to be removed from one power conductor in order to be installed on a second power conductor. Therefore, in certain embodiments, the connecting means is adapted to connect the voltage divider assembly to the power conductor releasably. It may be adapted to connect the voltage divider assembly to the power conductor manually releasable, i.e. without a need to use tools. A releasable connection may be obtained by the connecting means comprising, for example, a clamp, a clip, a latch, a thread, a screw, a thread, a threaded hole, or a bolt, for releasable engagement with the power conductor.

The connecting means is also suitable for electrically connecting a portion of the voltage divider assembly to the power conductor. For an electrical connection, the connecting means comprises a conductive, i.e. an electrically conductive, portion. This conductive portion is electrically connected with the plurality of discrete impedance elements, e.g. by a wire or by a conductive coating on a surface of an element of the voltage divider assembly.

When the connecting means mechanically connects the voltage divider assembly to the power conductor, the conductive portion of the connecting means is in electrical contact with the power conductor. Thereby, the conductive portion establishes an electrical connection between the plurality of discrete impedance elements and the power conductor, so that the voltage of the power conductor is available at the plurality of discrete impedance elements for sensing that voltage by the voltage-dividing sensor.

The conductive portion of the connecting means may comprise, or may be formed by, for example, a metal bar in or on the connecting means, or by a wire or braid or surface coating in or on the connecting means.

Alternatively, the conductive portion of the connecting means may be formed by the connecting means being made of an electrically conductive material, e.g. of a metal or a suitably selected conductive polymer. Examples of such connecting means are metal clamps, metal threads, metal screws, metal latch, metal clips, or slit metal blocks. In a preferred embodiment, the connecting means is a spring-loaded clamp of conductive metal, comprising two metal half-clamps which are urged towards each other by a spring, which can clamp a bus bar between its half clamps.

A voltage divider assembly according to the present disclosure comprises a plurality of discrete impedance elements. A discrete impedance element is a discrete capacitor, a discrete resistor or a discrete inductance. A discrete resistor, for example, is an individual, isolated resistor, e.g. one that can be soldered onto a printed circuit board ("PCB"). A plurality of discrete impedance elements may comprise one or more capacitors and/or one or more resistors and/or one or more inductances.

In certain embodiments, the voltage divider assembly exclusively comprises discrete capacitors, it exclusively comprises discrete resistors, or it exclusively comprises discrete inductances. Therefore, a plurality of discrete impedance elements may consist of a plurality of discrete capacitors, it may consist of a plurality of discrete resistors, or it may consist of a plurality of discrete inductances.

In certain preferred embodiments, all discrete impedance elements of the plurality of discrete impedance elements have the same nominal impedance. This may ensure a balanced, even voltage drop along the chain of discrete impedance elements from high voltage to lower voltage or ground. Also, utilizing identical discrete impedance elements may allow for a more cost-effective construction and assembly of the voltage divider assembly, based on the economies of scale.

In other embodiments, the voltage divider assembly has a combination of one or more discrete capacitors and one or more discrete resistors. The plurality of discrete impedance elements may thus consist of one or more discrete capacitors and one or more discrete resistors.

In other embodiments, the voltage divider assembly has a combination of one or more discrete capacitors and one or more discrete inductances. The plurality of discrete impedance elements may thus consist of one or more discrete capacitors and one or more discrete inductances.

In other embodiments, the voltage divider assembly has a combination of one or more discrete inductances and one or more discrete resistors. The plurality of discrete impedance elements may thus consist of one or more discrete inductances and one or more discrete resistors.

The plurality of discrete impedance elements is electrically connected in series with each other. In other words, the plurality of discrete impedance elements may form an electrical chain of discrete impedance elements. In that chain, each impedance element (except those impedance elements at the ends of the chain, referred to as "chain-terminating impedance elements") is electrically connected between two neighbouring impedance elements. This chain of discrete impedance elements is operable as a high-voltage side of a voltage-dividing sensor for sensing a voltage of the power conductor. The plurality of discrete impedance elements, electrically arranged between the high voltage of the power conductor and ground, or between the high voltage of the power conductor and a reduced voltage of less than 10% of the operating voltage of the power conductor, can divide the high voltage of the power conductor. As is commonly known for voltage dividers, the divided voltage is proportional to the voltage of the power conductor, so that knowledge of the proportionality factor and a measurement of the divided voltage allows for determination of the voltage of the power conductor.

The voltage divider assembly as described herein is electrically connected between the higher voltage of the power conductor and a lower voltage, e.g. a ground voltage of an external wall of the HV/MV switchgear. Any steep voltage gradient along the voltage divider assembly may result in an increased risk of electrical discharge between a portion of the voltage divider assembly on higher voltage and a portion on lower voltage. If, for example, a single impedance element were used to divide the voltage of the power conductor, a discharge across the impedance element is likely to occur. For a less steep, smoother voltage gradient between the ends of the chain of impedance elements, it is normally desirable that the plurality of discrete impedance elements comprise five or more, preferably ten or more discrete impedance elements. Since the voltage drop across each of these impedance elements is smaller, compared to a scenario with less impedance elements, the risk of an electrical discharge across any one of the impedance elements is reduced. Therefore, in certain preferred embodiments, the plurality of discrete impedance elements comprises ten or more, or fifteen or more discrete impedance elements.

In embodiments in which the voltage divider assembly has an elongate shape defining a length direction of the voltage divider assembly, a first end portion, an opposed second end portion and a middle portion, connecting the first with the second end portion of the voltage divider assembly, the first end portion may be electrically connected to the high voltage of the power conductor, and the second end portion may be connected to lower voltage or electrical ground. If the geometrical distance between the end portions is smaller, the risk of electrical discharges between the opposed end portions is generally higher. It is therefore desirable that the divider assembly has a certain geometrical extension between its end portions, i.e. a certain geometrical length. For MV/HV switchgears and the voltages present in such switchgears, the length may be 10 cm or greater, 15 cm or greater, or 20 cm or greater. Generally, in certain embodiments in which the voltage divider assembly has an elongate shape defining a length direction of the voltage divider assembly, a first end portion, an opposed second end portion and a middle portion, connecting the first and second end portions, the geometric extension of the voltage divider assembly, measured linearly between its opposed end portions and including the end portions, is 10 cm or greater, 15 cm or greater, or 20 cm or greater.

The discrete impedance elements may be connected with each other in a self-supporting way, e.g. by a wire. For greater mechanical robustness, however, the impedance elements can be mounted on a rigid or flexible substrate. In certain preferred embodiments, the plurality of discrete impedance elements is arranged on a printed circuit board. The printed circuit board may comprise conductive paths for electrically connecting discrete impedance elements with each other. It may comprise conductive paths for electrically connecting the plurality of discrete impedance elements with the connecting means or with the conductive portion of the connecting means. (impedance element connected with conductive portion of the connecting means) In order to be operated as a high-voltage side of the voltage dividing sensor, one end of the voltage-dividing chain of serially connected discrete impedance elements must be electrically connected with the power conductor. This connection is established via the conductive portion of the connecting means. The plurality of discrete impedance elements is therefore electrically connected with the conductive portion of the connecting means. Specifically, one of the chain-terminating impedance elements may be connected to the conductive portion of the connecting means. In use, this conductive portion, in turn, is electrically connected to the power conductor and hence to the high voltage of the power conductor.

More specifically, one discrete impedance element (namely one of the chain-terminating impedance elements) of the plurality of discrete impedance elements may be electrically connected with the conductive portion of the connecting means. This one chain-terminating impedance element may be the impedance element electrically arranged at a first end of the chain of impedance elements. This one impedance element may pick up the high voltage from the power conductor, whereby the high voltage of the power conductor can be divided by the plurality of discrete impedance elements.

The accuracy with which the voltage-dividing sensor can sense the voltage of the power conductor depends, inter alia, on the precision of the discrete impedance elements used in the voltage divider assembly. It is desirable that the sensing accuracy of the sensor be 2% or better (i.e. 2% or less, e.g. 1.5%), 1% or better, or even 0.5% or better. Many commercially available discrete impedance elements have a precision rating assigned to them, which is sometimes indicated on an outer surface of the element itself, e.g. by coloured rings. This rating indicates the precision, in % or otherwise, of the electrical impedance of an impedance element, e.g. the precision of the capacitance of a capacitor, the precision of the resistance of a resistor, or the precision of the inductivity of an inductance.

In certain preferred embodiments of the present disclosure, each of the plurality of discrete impedance elements has a precision rating of its electrical impedance of 2% or better, 1% or better, or 0.5% or better.

In certain preferred embodiments, all discrete impedance elements of the plurality of discrete impedance elements have the same precision rating of their electrical impedance. Utilizing identical discrete impedance elements may allow for a more cost-effective construction and assembly of the voltage divider assembly, based on economies of scale.

The voltage divider assembly may generally comprise a first portion and a second portion. The connecting means may be suitably arranged and adapted for mechanically connecting a first portion of the voltage divider assembly to the power conductor inside a compartment of a MV/HV switchgear.

Where the voltage divider assembly according to the present disclosure comprises a first portion and a second portion, the first portion may be a portion of the voltage divider assembly that comprises the connecting means and an element of the voltage divider assembly to which the connecting means is attached.

The geometric shape of a voltage divider assembly according to the present disclosure is not limited. In certain preferred embodiments, however, the voltage divider assembly has an elongate shape defining a length direction of the voltage divider assembly, wherein the plurality of discrete impedance elements is arranged linearly in a row defining a long direction, wherein the long direction of the row is parallel, within an angle of +/− 15°, to the length direction of the voltage divider assembly.

The voltage of the power conductor is divided down from kilovolts to a lower voltage, e.g. of 100 volt or lower, by the serially connected impedance elements. The more distant a discrete impedance element is electrically from the high voltage, the lower its voltage. Discrete impedance elements at voltages much lower than the voltage of the power conductor are thus potential targets for electrical discharges from the power conductor. An arrangement in which lower-voltage impedance elements are arranged further from the power conductor reduces the risk of electrical discharge between the power conductor (or those impedance elements on higher voltage) and those lower-voltage impedance elements. A linear arrangement of the discrete impedance elements from higher voltage to lower voltage provides that lower-voltage impedance elements can be located further away from the high voltage of the power conductor. An elongate shape of the voltage divider assembly as a whole provides that the desirable linear arrangement of the plurality of discrete impedance elements can be easily accommodated in the voltage divider assembly.

A linear row of discrete impedance elements uses the elongate shape of the voltage divider assembly best if it is oriented parallel to the length direction of the voltage divider assembly. It is considered that a deviation by an angle up to 15° on either side is still a good use of the elongate shape of the divider assembly, and that the corresponding increase in risk of discharge might be acceptable.

A desirable maximum distance of discrete impedance elements on lower voltage from the power conductor can be achieved if the voltage divider assembly has an elongate shape and the connecting means is arranged at one end of the elongate voltage divider assembly. Hence, in certain preferred embodiments of the present disclosure, the voltage divider assembly has an elongate shape defining a length direction of the voltage divider assembly, a first end portion, an opposed second end portion and a middle portion, connecting the first end portion with the second end portion of the voltage divider assembly, wherein the first end portion comprises the connecting means.

In certain of these embodiments, the middle portion comprises the plurality of discrete impedance elements. This arrangement may be particularly space-saving.

Independent of the shape of the voltage divider assembly, it may be desirable to protect the plurality of discrete impedance elements, or some of the discrete impedance elements of the plurality, against environmental effects and mechanical or electrical impacts during assembly, installation and during use in the MV/HV switchgear. Therefore, in certain embodiments of the voltage divider assembly, the plurality of discrete impedance elements is embedded in a solid, electrically insulating encapsulation body. The encapsulation body may reduce the risk of electrical discharges between discrete impedance elements on different voltages. In some of these embodiments, the plurality of discrete impedance elements is embedded in a solid, electrically insulating encapsulation body which contacts all exposed surfaces of the discrete impedance elements. Such an encapsulation body may comprise a reduced the number of air pockets in it. This may reduce the risk of discharges within the encapsulating body.

The encapsulation body may be made from, or comprise, an electrically insulating casting resin, e.g. an epoxy resin. The resin may initially be liquid when cast around the discrete impedance elements, and later harden, e.g. by curing. In certain embodiments the encapsulation body is transparent, thereby allowing visual inspection of the impedance elements. In other embodiments, the encapsulation body is opaque, thereby concealing the impedance elements from undesired views. The encapsulation body may be rigid, and thereby increase the mechanical stability of the voltage divider assembly. For enhanced protection, the entire voltage divider assembly may be embedded in a solid, electrically insulating encapsulation body.

Where the voltage divider assembly has an elongate shape defining a length direction of the voltage divider assembly, a first end portion, an opposed second end portion and a middle portion, connecting the first and second end portions, of the voltage divider assembly, and wherein the plurality of discrete impedance elements is arranged in the middle portion, the middle portion may be embedded in a solid, electrically insulating encapsulation body. In some embodiments, the first end portion, the second end portion and the middle portion are embedded in a solid, electrically insulating encapsulation body.

It is normally desired to measure the voltage of the power conductor at a location outside the MV/HV switchgear, e.g. in a so-called RTU box which contains suitable electronics. For that purpose, the voltage divided by the plurality of discrete impedance elements and indicative of a voltage of the power conductor ("signal voltage") can be made available outside the switchgear by attaching the voltage divider assembly to an inner surface of an external wall of the switchgear. The external wall may be a wall delimiting the compartment containing the power conductor. For attachment to an inner surface of an external wall of the switchgear, the voltage divider assembly may comprise a feedthrough element having attachment means for attachment to an inner surface of an external wall of the switchgear. The feedthrough element may be operable to make a voltage, divided by the plurality of discrete impedance elements and indicative of the voltage of the power conductor, available, through an opening in an external wall of the switchgear, outside the switchgear for measurement.

In order to reduce the risk of discharges, attachment to an external wall of the switchgear should be done as far as possible from the power conductor and the connecting means. Hence, in a voltage divider assembly according to the present disclosure which has an elongate shape defining a length direction of the voltage divider assembly, a first end portion, an opposed second end portion and a middle portion, connecting the first and second end portions, of the voltage divider assembly, wherein the first end portion comprises the connecting means, the second end portion may comprise the feedthrough element.

The feedthrough element may comprise, or be made of, an insulating material. Where the discrete impedance elements of the voltage divider assembly are embedded in an electrically insulating encapsulation body, e.g. a solid encapsulation body, as described herein, a portion of the encapsulation body may comprise or form the feedthrough element.

The feedthrough element may be fixedly or movably attached to other portions of the voltage divider assembly. Where the voltage divider assembly has an elongate shape defining a length direction of the voltage divider assembly, a first end portion, an opposed second end portion and a middle portion connecting the first and second end portions, the feedthrough element may be fixedly or movably attached to the middle portion.

The feedthrough element may comprise attachment means for attachment to an inner surface of an external wall of the switchgear. Such attachment means may be, or comprise, a thread, a screw, a thread, a threaded hole, a bolt, a clip, a latch, or the like. Other attachment means may be, or comprise, a layer of adhesive or a magnetic element.

The external walls of many MV/HV switchgears are flat, and so is their inner surface. For reliable and easier attachment of the feedthrough element, it may thus be advantageous for the feedthrough element to comprise a flat mounting surface. The flat mounting surface may adapted to facilitate attachment of the feedthrough element to a flat inner surface of an external wall. The flat mounting surface may comprise attachment means for attachment of the feedthrough element to an inner surface of an external wall of the switchgear. Such attachment means may be, or comprise, a thread, a screw, a thread, a threaded hole, a bolt, a clip, a latch, or the like. Other attachment means may be, or comprise, a layer of adhesive or a magnetic element.

Gas-insulated switchgears contain insulation gas, mostly pressurized, such as SF6 gas, to reduce the risk of discharges and mitigate the effects of arcing. Where a feedthrough element as described above makes a signal voltage available at an opening in an external wall of the switchgear, measures must be put in place to prevent the pressurized gas from escaping through the opening. A feedthrough element as described above may therefore further comprise a seal for sealing a gap between the feedthrough element and the external wall, when the feedthrough element is attached to the inner surface of the external wall. The seal may be, for example, an O-ring or a conformable portion of the feedthrough element.

Where the feedthrough element comprises a mounting surface, e.g. a flat mounting surface, the feedthrough element may comprise a groove in the mounting surface for accommodating the seal.

The signal voltage may be made available outside the voltage divider assembly, or outside the switchgear, via a signal wire. The signal wire may exit the voltage divider assembly at a recess in the mounting surface of the feedthrough element. In that case, the seal may be arranged such as to surround the recess. Where the feedthrough element comprises a groove for accommodating the seal, the groove may be arranged such as to surround the recess.

In a power network of a national grid, a voltage divider assembly as described herein may be installed on a power conductor of a MV/HV switchgear in a compartment of the switchgear, and thereby help to provide the switchgear with a voltage sensing functionality. The present disclosure thus also provides a switchgear for a switching a voltage of 1 kilovolt or higher and a current of 10 Amperes or more, comprising an internal compartment, a power conductor inside the compartment for conducting the voltage and the current, and a voltage divider assembly as described herein, installed on the power conductor and operable in a voltage-dividing sensor for sensing a voltage of the power conductor.

A power network of a national grid may be provided with a voltage divider assembly as described herein, in order to provide the power network and a MV/HV switchgear in the network with a voltage sensing functionality. The present disclosure thus also provides a power distribution network for distributing electrical power in a national grid at voltages of 1 kilovolt or higher and currents of 10 Amperes or more, comprising a voltage divider assembly as described herein.

BRIEF DESCRIPTION OF THE DRAWINGS

The following is a more detailed disclosure of voltage divider assemblies according to the present disclosure with reference to Figures exemplifying a particular embodiment of the disclosure.

DETAILED DESCRIPTION

Figure 1:
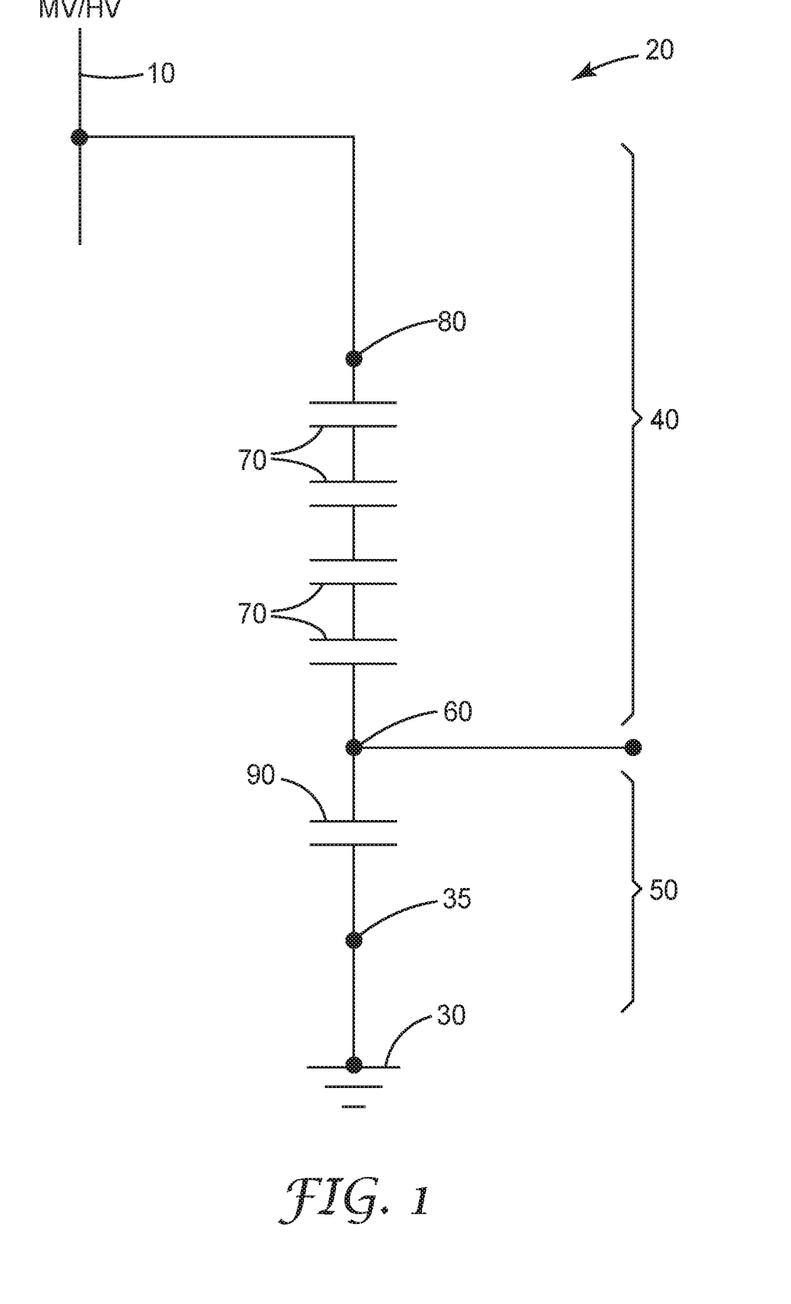
FIG. 1 Circuit diagram of a known voltage divider.

The circuit diagram of FIG. 1 illustrates the principle of a voltage divider for sensing a voltage of a MV/HV power conductor 10, such as a bus bar in a MV/HV switchgear. This principle can be used in voltage divider assemblies according to the present disclosure. When in use, the power conductor 10 is typically at a medium or high voltage of between 1 kV and 100 kV with respect to electrical ground and conducts alternating currents (AC) of tens of amperes up to hundreds of amperes.

The voltage divider 20 comprises a high-voltage side 40, a low-voltage side 50, a signal contact 60 and a grounding contact 35 for connection to electrical ground 30. For sensing the voltage of the power conductor 10, the high-voltage side 40 is conductively connected to the power conductor 10, and the low-voltage side 50 is connected to electrical ground 30. A divided voltage can be picked up at the signal contact 60 between the high-voltage side 40 and the low-voltage side 50. The divided voltage is proportional to the voltage of the power conductor 10, with the proportionality factor being the dividing ratio of the voltage divider 20. By measuring the divided voltage, this proportionality is used for sensing the voltage of the power conductor 10.

The voltage divider 20 shown in FIG. 1 is a capacitive voltage divider 20 for sensing alternating (AC) voltages. Its high-voltage side 40 consists of four dividing capacitors 70, electrically connected in series between a high-voltage contact 80 and a signal contact 60 of the voltage divider 20. The signal contact 60 provides access to the divided voltage. Each of the four dividing capacitors 70 has a capacitance of 80 picofarad (pF), so that they provide a combined capacitance of 20 pF. Alternative voltage dividers can be built using other types of impedance elements, such as resistors or inductances, instead of capacitors.

In this embodiment, the low-voltage side 50 of the voltage divider 20 comprises a single capacitor 90, referred to as the low-voltage capacitor 90. It is connected between the signal contact 60 and electrical ground 30. The low-voltage capacitor 90 has a capacitance of 200 nF (nanofarad).

The dividing ratio of the voltage divider 20 is about 1:10 000. If the power conductor 10 is at 50 kV, the output voltage of the voltage divider 20 at the signal contact 60 is about 5 V. Voltages of that magnitude can be processed by standard electronic circuitry.

The large voltage drops across the four dividing capacitors 70 from 50 kV to 5 V on the high-voltage side 40 of the voltage divider 20 requires specific mechanical and electrical designs, as will be explained below.

Figure 2:
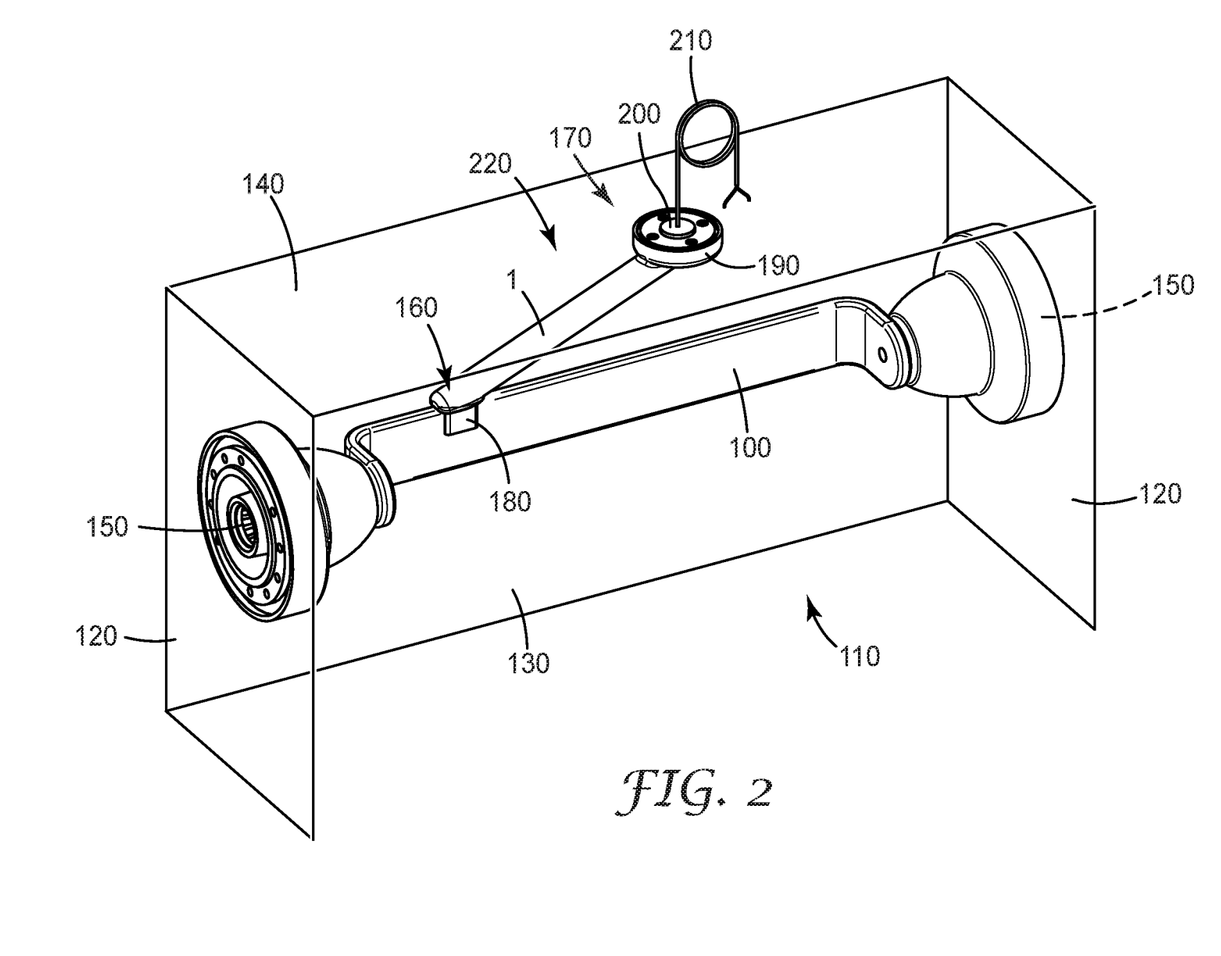
FIG. 2 Perspective view of a first voltage divider assembly according to the present disclosure, installed on a power conductor in a switchgear.

FIG. 2 illustrates, in a perspective view, a first voltage divider assembly 1 according to the present disclosure, installed on a busbar 100 in a compartment 110 of a MV switchgear. The first voltage divider assembly 1 comprises a high-voltage side 40 of a voltage divider as shown in FIG. 1. The compartment 110 is delimited by walls, of which only two opposed side walls 120, a rear wall 130 and a top wall 140 are shown in FIG. 2. The compartment 110 is filled with pressurized SF6 (sulphur hexafluoride) gas, which is a common dielectric insulation medium used in gas-insulated switchgears. The side walls 120, the rear wall 130 and the top wall 140 are external walls of the switchgear. The busbar 100 is a power conductor which conducts power between two externally accessible connectors 150, of which only one is visible in FIG. 2.

The first voltage divider assembly 1 is installed on the busbar 100 and extends between the busbar 100 and the top wall 140. The voltage divider assembly 1 has an elongate shape defining a first end portion 160, an opposed second end portion 170 and a middle portion 220 connecting the end portions 160, 170 with each other.

The first end portion 160 comprises a clamp 180 of conductive metal, by which the first end portion 160 is mechanically and electrically connected to the busbar 100.

The second end portion 170 comprises a feedthrough element 190 by which the second end portion 170 is mechanically connected to the top wall 140 in an area of the top wall 140 where the top wall 140 comprises a wall opening 200. A signal wire 210, connected to a signal contact 60 (not visible in FIG. 2) of the voltage divider assembly 1, leads from the inside of the compartment 110 to an outside of the switchgear through the wall opening 200 and makes the divided voltage available outside the switchgear.

In order to maintain the gas pressure inside the compartment 110, the feedthrough element 190 is equipped with a seal, as will be explained in more detail with reference to FIG. 3.

Figure 3:
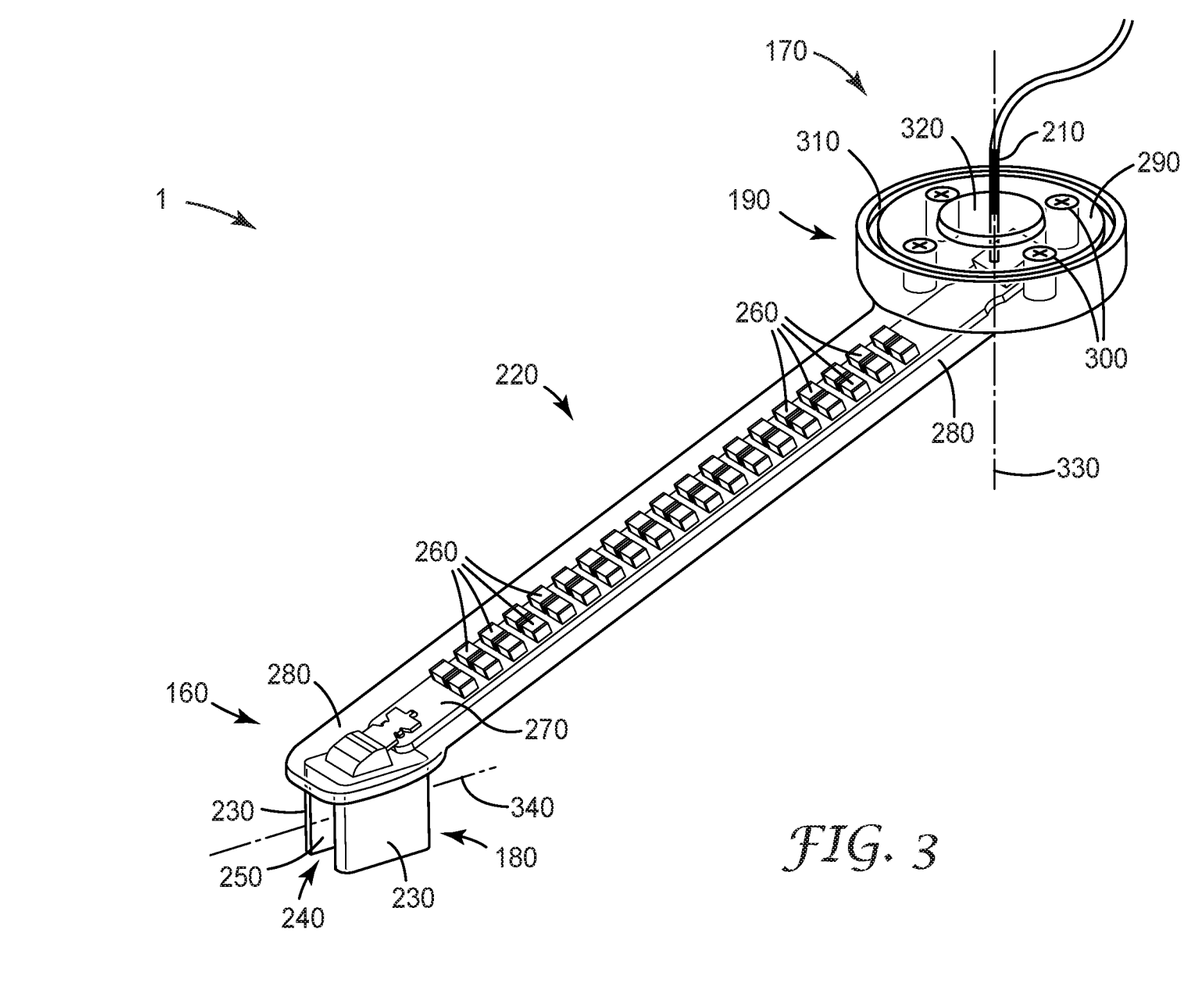
FIG. 3 Perspective view of the first voltage divider assembly.

FIG. 3 shows the first voltage divider assembly 1 in greater detail. It comprises connecting means 180 to connect it to the busbar 100, the feedthrough element 190 to attach to an external wall, and the high-voltage side of a voltage divider for sensing the voltage of the busbar 100.

Looking at the first end portion 160, it can be seen that the clamp 180 comprises two grippers 230, whose flat parallel grip surfaces 250 face each other and form a slot 240 between them, which can receive a section of a busbar 100. The grippers 230 are urged towards each other by a spring (not shown), which urges the opposed grip surfaces 250 towards each other in a direction parallel to their surface normals. The clamp 180 mechanically connects the voltage divider assembly 1 to the busbar 100 by the grippers 230 being pressed against the outer surface of the busbar 100. The clamp 180 and the grippers 230 being electrically conductive, the clamp 180 connects the voltage divider assembly 1 also electrically to the busbar 100. The grippers 230 are made from a soft, electrically conductive metal, e.g. copper, in order to provide a reliable electrical surface contact between the busbar 100 and the voltage dividing assembly 1.

It is contemplated that the shape of the grippers 230 may be adapted to the cross section or profile of the busbar 100, or of another type of power conductor, with which they engage.

The middle portion 220 of the voltage divider assembly 1 comprises the high-voltage side 40 of the voltage divider 20 which facilitates sensing the voltage of the busbar 100. The high-voltage side 40 of the voltage divider 20 consists of nineteen discrete high-voltage capacitors 260, which are electrically connected in series with each other. In analogy to the capacitors 70 in the high-voltage side 40 of the voltage divider 20 shown in FIG. 1, the high-voltage capacitors 260 are operable as a high-voltage side of a voltage-dividing sensor for sensing the voltage of the busbar 100.

All high-voltage capacitors 260 have the same capacitance of 100 pF (picofarad), with an accuracy of 0.5 percent.

The high-voltage capacitors 260 are geometrically arranged linearly such as to form a straight chain of discrete capacitors 260, which will therefore also be referred to as "capacitor chain" herein. Each high-voltage capacitor 260 is electrically connected to its two nearest neighbour capacitors 260, except for those capacitors 260 at the opposed ends of the chain. The high-voltage capacitor 260 at the end of the chain close to the clamp 180, i.e. the higher-voltage end of the chain, is electrically connected with the grippers 230 for connection to the busbar 100. The high-voltage capacitor 260 at the end of the chain close to the feedthrough element 190, i.e. at the lower-voltage end of the chain, is electrically connected to one neighbouring capacitor 260 and to the signal contact 60 (not shown in FIG. 3).

The signal contact 60, in turn, is connected to the signal wire 210 which conducts the divided voltage of the signal contact 60, also referred to as the "signal voltage", to the outside of the voltage divider assembly and of the switchgear. Outside the switchgear, the low-voltage side 50 of the voltage divider 20 provides an electrical connection to ground 30, and the voltage between ground 30 and the signal wire 210 is proportional to the voltage of the busbar 100 versus ground.

The high-voltage capacitors 260 are arranged on a printed circuit board ("PCB") 270, which extends from the first end portion 160 to the second end portion 170 and from the clamp 180 to the feedthrough element 190. Conductive traces on the underside of the PCB 270 provide the electrical connections between adjacent high-voltage capacitors 260. A conductive trace also establishes an electrical connection between the high-voltage capacitor 260 at the higher-voltage end of the divider chain (at the lower left in FIG. 3) and the grippers 230. Also the signal contact 60 (not visible in FIG. 3) is arranged on the PCB 270, so that an electrical connection exists between the grippers 230 of the clamp 180, through the chain of high-voltage capacitors 260 to the signal contact and the signal wire 210.

While the clamp 180 connects to the busbar 100, it is on a voltage of several tens of kilovolts. At the opposite end of the voltage divider assembly 1, the feedthrough element 190 can be connected to an external wall 140 of the switchgear, which is normally held on ground potential for safety reasons. Therefore, a considerable voltage difference exists between the opposed ends 160, 170 of the voltage divider assembly 1. The voltage drops from one end to the other occurs stepwise from one discrete high-voltage capacitor 260 to the next. However, a risk exists that the high voltage of the clamp 180 discharges, through the gas in the switchgear, directly to an element on lower voltage, e.g. to the feedthrough element 190 or to one of the high-voltage capacitors 260 closer to the lower-voltage end of the capacitor divider chain.

In order to reduce the risk of such discharges, the chain of high-voltage capacitors 260 and the PCB 270 are embedded in an encapsulating body 280 made from an electrically insulating casting resin comprising epoxy resin. The encapsulating body 280 is transparent, thereby allowing visual inspection of the high-voltage capacitors 260 and of the PCB 270. The encapsulating body 280 is solid and rigid and thus provides mechanical stability to the voltage dividing assembly 1.

It is contemplated that in an alternative voltage divider assembly it may be advantageous to provide an opaque, i.e. non-transparent, encapsulating body instead of a transparent encapsulating body 280, as it may, for example, be desired to conceal the high-voltage capacitors 260 or the PCB 270 from the view of unauthorized persons.

At the second end portion 170, the voltage divider assembly 1 will be fixed, on the inside of the switchgear, to an external wall 140 of the switchgear, where the external wall 140 has an opening 200 through which the signal wire 210 can be fed to outside the switchgear. For this purpose, the voltage divider assembly 1 comprises the feedthrough element 190 which is formed by a portion of the encapsulating body 280. The encapsulating body 280 thus comprises a first portion encapsulating the high-voltage capacitors 260 and the PCB 270, and a second portion forming the feedthrough element 190.

The feedthrough element 190 has a toroidal shape, i.e. a donut shape with a central recess 320. The upper side of the "donut" comprises a flat mounting surface 290 for a flush attachment to the flat wall 140. The mounting surface 290 is provided with four screw holes 300, which facilitate attachment to the wall 140 by screws, and with a circumferential groove 310, which can receive an O-ring type seal (not shown) that slightly protrudes from the mounting surface 290. Once the screws through the wall 140 are tightened in the screw holes 300, the mounting surface 290 and the seal is pressed against the inner surface of the external wall 140. In this state, the seal prevents the pressurized gas in the switchgear from escaping through the opening 200 in the wall 140.

The mounting surface 290 forms a central recess 320, surrounded by the O-ring groove 310, through which recess 320 the signal wire 210 exits the voltage divider assembly 1. The central recess 320 is positioned on the opening 200 in the external wall 140 when the voltage divider assembly 1 is attached to the inner surface of the external wall 140. While the seal ensures that no gas can escape from the switchgear through the wall opening 200, the signal wire 210 can be led to an outside of the switchgear through the central recess 320 and the opening 200 in the external wall 140.

The presence of the voltage divider assembly 1 in the electrical field between the busbar 100 and a grounded external wall 120, 130, 140 of the switchgear generally results in an increased risk of discharge. A steep voltage gradient (and thereby a higher risk of discharge) exists between the high voltage of the busbar 100 and the point of a grounded external wall 120, 130, 140 of the switchgear closest to the busbar 100. The gradient steepness and the discharge risk is less for more distant points of the external wall 120, 130, 140.

In order for the voltage divider assembly 1 to create little additional risk for discharges, the feedthrough element 190 should be positioned at a distance from the point of the wall 120, 130, 140 which is closest to the busbar 100. Since most busbars 100 extend parallel or perpendicular to the external walls 120, 130, 140, this requirement results in a skew, angled design of the voltage divider assembly 1. In the embodiment in FIG. 2, the surface normal 330 of the planar mounting surface 290 and the direction of the long extension of the elongate middle portion 220 of the voltage divider assembly 1 form an angle of about 60°. Similarly, the long direction 340 of the slot 240 and the direction of the long extension of the elongate middle portion 220 of the voltage divider assembly 1 form an angle of about 30°.

For a given position of a busbar 100 relative to an external wall 120, 130, 140 of a switchgear, the shape of the voltage divider assembly 1 determines where an opening 200 should be created in the external wall 140 for guiding the signal wire 210 to the outside of the switchgear, and where holes for screws for engaging with the screw holes 300 in the feedthrough element 190 should be positioned. The fact that the clamp 180 can be attached to the busbar 100 anywhere along its length provides for a certain degree of freedom in positioning the opening 200.

In order to allow for more freedom in positioning the opening 200 in the external wall 140, the clamp 180 can be made rotatable, relative to the middle portion 220, in a plane parallel to the plane of the mounting surface 290.

The invention claimed is:

1. Voltage divider assembly for installation on a power conductor inside a compartment of a MV/HV switchgear in a power network of a national grid, wherein the voltage divider assembly is operable to divide a voltage of the power conductor in a voltage-dividing sensor for sensing a voltage of the power conductor, wherein the voltage divider assembly comprises a) connecting means, comprising a conductive portion, for mechanically and electrically connecting the voltage divider assembly to the power conductor; and b) a plurality of discrete impedance elements, electrically connected (i) with the conductive portion of the connecting means and (ii) in series with each other such as to be operable as a high-voltage side of the voltage-dividing sensor, wherein the voltage divider assembly has an elongate shape defining a length direction of the voltage divider assembly, wherein the plurality of discrete impedance elements is arranged linearly in a row defining a long direction, wherein the long direction of the row is parallel, within an angle of +/−15°, to the length direction of the voltage divider assembly.

2. Voltage divider assembly according to claim 1, having an elongate shape defining a length direction of the voltage divider assembly, a first end portion, an opposed second end portion and a middle portion, connecting the first and second end portions of the voltage divider assembly, wherein the first end portion comprises the connecting means.

3. Voltage divider assembly according to claim 2, wherein the connecting means is movable relative to the middle portion.

4. Voltage divider assembly according to claim 2, wherein the second end portion comprises a feedthrough element having attachment means for attachment to an inner surface of an external wall of the MV/HV switchgear, the feedthrough element being operable to make a voltage divided by the plurality of discrete impedance elements, and indicative of the voltage of the power conductor, available, through an opening in the external wall, outside the MV/HV switchgear for measurement.

5. Voltage divider assembly according to claim 4, wherein the feedthrough element further comprises a seal for sealing a gap between the feedthrough element and the external wall, when the feedthrough element is attached to the inner surface of the external wall.

6. Voltage divider assembly according to claim 2, wherein the geometric extension of the voltage divider assembly, measured linearly between its opposed end portions and including the end portions, is 10 cm or greater, 15 cm or greater, or 20 cm or greater.

7. Voltage divider assembly according to claim 1, wherein the connecting means is adapted to connect the voltage divider assembly to the power conductor releasably.

8. Voltage divider assembly according to claim 1, wherein the plurality of discrete impedance elements is arranged on a printed circuit board.

9. Voltage divider assembly according to claim 1, further comprising a signal wire for making a voltage divided by the plurality of discrete impedance elements, and indicative of the voltage of the power conductor, available for measurement.

10. Voltage divider assembly according to claim 1, wherein the plurality of discrete impedance elements comprises ten or more discrete impedance elements.

11. Voltage divider assembly according to claim 1, wherein each of the plurality of discrete impedance elements has a precision rating of its electrical impedance of 2%, 1%, 0.5% or better.

12. Voltage divider assembly according to claim 1, wherein the plurality of discrete impedance elements is embedded in a solid, electrically insulating encapsulation body.

13. Switchgear for a switching voltage of 1 kilovolt or higher and a current of 10 Amperes or more, comprising an internal compartment, a power conductor inside the compartment for conducting the voltage and the current, and a voltage divider assembly according to claim 1, installed on the power conductor and operable in a voltage-dividing sensor for sensing a voltage of the power conductor.

14. Power distribution network for distributing electrical power in a national grid at voltages of 1 kilovolt or higher and currents of 10 Amperes or more, comprising a voltage divider assembly according to claim 1.

* * * * *